(12) United States Patent
Minamio et al.

(10) Patent No.: US 7,049,684 B2
(45) Date of Patent: May 23, 2006

(54) LEAD FRAME AND METHOD OF PRODUCING THE SAME, AND RESIN-ENCAPSULATED SEMICONDUCTOR DEVICE AND METHOD OF PRODUCING THE SAME

(75) Inventors: Masanori Minamio, Takatsuki (JP); Hiroshi Horiki, Funai-gun (JP); Toshiyuki Fukuda, Nagaokakyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 156 days.

(21) Appl. No.: 10/697,180

(22) Filed: Oct. 29, 2003

(65) Prior Publication Data
US 2004/0089921 A1    May 13, 2004

(30) Foreign Application Priority Data
Nov. 1, 2002    (JP)    ............................. 2002-319747

(51) Int. Cl.
*H01L 23/495*    (2006.01)
(52) U.S. Cl. ...................... 257/666; 257/676; 257/686; 257/723; 257/777; 438/123; 438/107; 438/108; 438/109
(58) Field of Classification Search ...................... None
See application file for complete search history.

(56) References Cited

U.S. PATENT DOCUMENTS

| | | | |
|---|---|---|---|
| 5,471,088 A * | 11/1995 | Song ........................... 257/668 |
| 6,303,997 B1 * | 10/2001 | Lee ............................. 257/778 |
| 6,337,510 B1 * | 1/2002 | Chun-Jen et al. ........... 257/666 |
| 6,605,866 B1 * | 8/2003 | Crowley et al. ............. 257/692 |
| 6,700,187 B1 * | 3/2004 | Paek ........................... 257/673 |
| 6,730,544 B1 * | 5/2004 | Yang .......................... 438/110 |

FOREIGN PATENT DOCUMENTS

| | | |
|---|---|---|
| JP | 2000-307049 | 11/2000 |
| JP | 2001-077277 | 3/2001 |
| JP | 2002-043554 | 2/2002 |

\* cited by examiner

*Primary Examiner*—David Nelms
*Assistant Examiner*—Long Tran
(74) *Attorney, Agent, or Firm*—Hamre, Schumann, Mueller & Larson, P.C.

(57) ABSTRACT

A resin-encapsulated semiconductor device includes a semiconductor chip, a plurality of inner leads that are connected to a group of electrodes of the semiconductor chip, respectively, and an encapsulating resin that encapsulates a connection part located between the semiconductor chip and the inner leads. Each of the inner leads includes a protruded portion provided on a surface thereof on an outer side relative to the periphery of the semiconductor chip. The protruded portion protrudes in a thickness direction and is provided with a step portion formed in its side portion. The group of electrodes of the semiconductor chip is connected to surfaces of inner portions of the inner leads located on an inner side relative to their protruded portions, through electroconductive bumps, respectively. The encapsulating resin encapsulates the semiconductor chip and the electroconductive bumps and is formed to expose surfaces of the protruded portions. The surfaces of the protruded portions that function as external terminals can be reduced in size and thereby the pitch between the external terminals can be reduced.

14 Claims, 7 Drawing Sheets

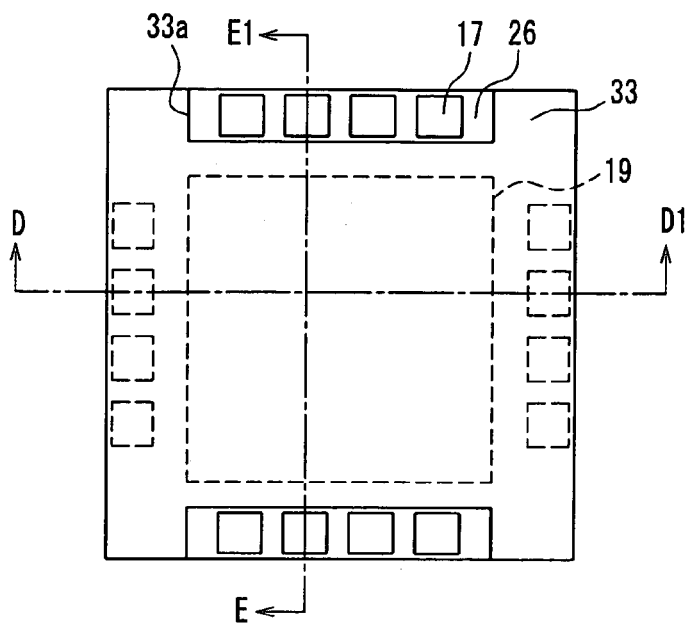
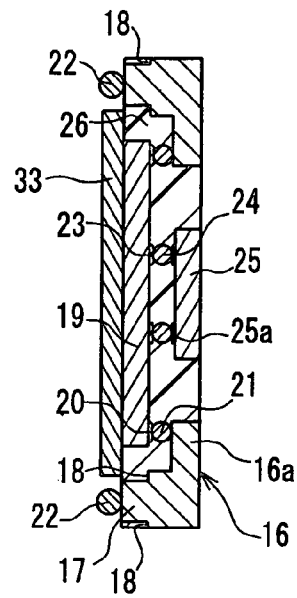
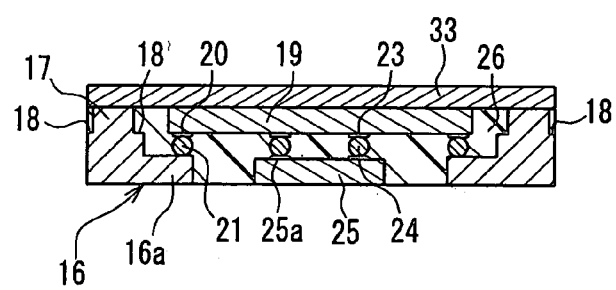
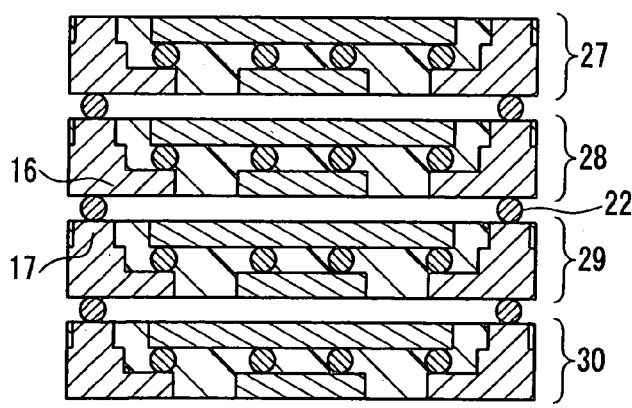
FIG. 3A
FIG. 3C
FIG. 3B
FIG. 3D

US 7,049,684 B2

LEAD FRAME AND METHOD OF PRODUCING THE SAME, AND RESIN-ENCAPSULATED SEMICONDUCTOR DEVICE AND METHOD OF PRODUCING THE SAME

BACKGROUND OF THE INVENTION

1. Field of the Invention

The present invention relates to a resin-encapsulated semiconductor device with a lead frame. Particularly, it relates to a structure that is suitable for achieving the reduction in thickness and the increase in speed of elements, and a structure that is employed for achieving three-dimensional mounting of a plurality of resin-encapsulated semiconductor devices, in a resin-encapsulated semiconductor device called SIP (System In Package). Furthermore, the present invention relates to a lead frame used therein and the method of producing the same as well as the method of producing a resin-encapsulated semiconductor device.

2. Related Background Art

Conventionally, a resin-encapsulated semiconductor device called "QFN (Quad Flat Non-leaded Package)", only one side of which is encapsulated with an encapsulating resin, has been developed as a compact and thin resin-encapsulated semiconductor device. The following will describe the conventional QFN-type resin-encapsulated semiconductor device.

First of all, the following describes a lead frame used in a resin-encapsulated semiconductor device. FIG. 6 is a plan view illustrating a conventional lead frame 1. This lead frame 1 has a structure in which a die pad 4 arranged substantially at the center of an opening region 3 of a frame 2 is supported by hanging leads 5. One end of each of the hanging leads 5 is connected with each of the corners of the die pad 4, while the other end thereof is connected with the frame 2. Further, the frame 2 is provided with a plurality of inner leads 6, which are arranged so that their ends face corresponding edges of the die pad 4.

Next, the following describes a conventional resin-encapsulated semiconductor device employing the foregoing lead frame. FIGS. 7A and 7B show a conventional resin-encapsulated semiconductor device. FIG. 7A is a bottom view of a resin-encapsulated semiconductor device, and FIG. 7B is a cross-sectional view of the device taken along line A–A1 shown in FIG. 7A. A semiconductor chip 7 is bonded to the die pad 4, and the frame 2 of the lead frame 1 (see FIG. 6) is cut away, so that the inner leads 6 are separated from one another. Electrodes 8 of the semiconductor chip 7 are connected electrically with the surfaces of the inner leads 6 through thin metal wires 9, respectively. The surroundings of the semiconductor chip 7 are encapsulated with an encapsulating resin 10, with the bottom face of the die pad 4 and the bottom faces of the inner leads 6 being exposed. The bottom faces and side faces of the inner leads 6 are exposed at a bottom face and side faces of the package 11, respectively, thereby forming external terminals 12.

Next, the following describes a method of producing the resin-encapsulated semiconductor device shown in FIGS. 7A and 7B. FIGS. 8A to 8E illustrate steps of the production method by showing, like FIG. 7B, the cross-sections taken along line A–A1 indicated in FIG. 7A.

First, a lead frame 1 is prepared as shown in FIG. 8A. This lead frame 1 is the same as that shown in FIG. 6, though the illustration of the frame 2 (see FIG. 6) is omitted therein. The drawing shows a die pad 4 on which a semiconductor chip is to be mounted, and one of a plurality of inner leads 6 arranged so that their ends face the corresponding edges of the die pad 4. Next, as shown in FIG. 8B, a semiconductor chip 7 is mounted on the die pad 4 of the lead frame 1 by bonding. Then, as shown in FIG. 8C, the semiconductor chip 7 is connected electrically with surfaces of the inner leads 6 through thin metal wires 9.

Subsequently, as shown in FIG. 8D, the surroundings of the die pad 4, the surfaces of the inner leads 6, and the semiconductor device 7 are covered with a molding die 13 to be encapsulated with an encapsulating resin. Thereafter, as shown in FIG. 8E, the package 11 that has been encapsulated with the encapsulating resin 10 is taken out of the molding die. Thus, a resin-encapsulated semiconductor device is completed in which the bottom faces and outer side faces of the inner leads 6 are arranged in the bottom of the package 11 to serve as external terminals 12 (see, for instance, JP2000-307049A).

However, the conventional resin-encapsulated semiconductor device as described above is very thick as a whole since the thin metal wires are used for connecting the electrodes of the semiconductor chip with the inner leads, and hence, there are limits to the reduction in thickness of the device. Furthermore, since no consideration has been given to the size of the exposed faces of the inner leads that form the external terminals, the above-mentioned structure was not suitable for reducing the size of the external terminals and the pitch of the external terminals, i.e. the distance between the external terminals.

In addition, in a situation where high-speed signals or high-frequency signals operate, loss of signals in the thin metal wires becomes a problem, which prevents the semiconductor chip from fully functioning.

Moreover, since the external terminals are exposed only at the bottom face of the resin-encapsulated semiconductor device, when a plurality of resin-encapsulated semiconductor devices are stacked on top of each other, no electric connection can be established between the devices through their external terminals. Thus, it is difficult to implement the three-dimensional packaging.

SUMMARY OF THE INVENTION

A lead frame of the present invention includes a frame, and a plurality of inner leads extending inward from the frame, wherein the inner lead includes a protruded portion provided on a surface of its outer portion, the protruded portion protrudes in a thickness direction, and a step portion is formed in a side portion of the protruded portion.

In this lead frame, the protruded portion has a reduced cross-section on its tip side relative to the step portion. Hence, the tip face of the protruded portion that functions as an external terminal has a reduced area, which allows a reduced pitch to be obtained between the tip faces of the protruded portions of the respective inner leads.

A method of producing a lead frame of the present invention includes: forming a structure including a frame and a plurality of inner leads extending inward from the frame; half-etching or pressing a part of the surface of the inner leads to form a protruded portion on the surface; and then carrying out half-etching or pressing again from the surroundings of the surface of the protruded portion to form a step portion in its side portion. With this method, the step portion can be formed easily in the protruded portion.

A resin-encapsulated semiconductor device of the present invention includes: a semiconductor chip; a plurality of inner leads that are arranged along a periphery of the semiconductor chip and are connected to a group of electrodes of the semiconductor chip, respectively; and an encapsulating resin that encapsulates a connection part located between the semiconductor chip and the inner leads. A part of each of the inner lead is exposed from the encapsulating resin to form an external terminal. The inner lead includes a protruded portion that protrudes in the thickness direction and is provided on its surface on the outer side relative to the periphery of the semiconductor chip. The protruded portion has a step portion formed in its side portion. The group of electrodes of the semiconductor chip is connected to the surfaces of inner portions of the inner leads located on the inner side relative to their protruded portions, through electroconductive bumps, respectively. The encapsulating resin is formed so as to encapsulate the semiconductor chip and the electroconductive bumps and to expose the surfaces of the protruded portions.

In this configuration, the protruded portion of the inner lead has a reduced cross-section on its tip side relative to the step portion. Hence, the tip face of the protruded portion that functions as an external terminal has a reduced area, which allows a reduced pitch to be obtained between the tip faces of the protruded portions of the respective inner leads.

In a method of producing a resin-encapsulated semiconductor device of the present invention, a lead frame is employed that includes a frame and a plurality of inner leads extending inward from the frame. In the lead frame, the inner lead has a protruded portion on the surface of its outer portion, and the protruded portion protrudes in a thickness direction with a step portion formed in a side portion of the protruded portion. The method includes steps of: forming first electroconductive bumps on the surfaces of the inner leads on the inner side relative to their protruded portions; stacking a second semiconductor chip with a smaller size than that of a first semiconductor chip, on the surface of the first semiconductor chip, and electrically connecting a first group of electrodes of the first semiconductor chip with a group of electrodes of the second semiconductor chip through second electroconductive bumps; electrically connecting the first electroconductive bumps with a second group of electrodes of the first semiconductor chip formed on the outer side relative to the region of the first semiconductor chip to which the second semiconductor chip has been connected; and encapsulating the region including the surfaces of the first and second semiconductor chips and the first and second electroconductive bumps using an encapsulating resin, with the surfaces of the protruded portions being substantially in the same plane as the outer face of the encapsulating resin and being exposed from the encapsulating resin.

Another method of producing a resin-encapsulated semiconductor device of the present invention employs the same lead frame as that used in the above-mentioned production method. This method includes steps of forming first electroconductive bumps on the surfaces of the inner leads on the inner side relative to their protruded portions; stacking a second semiconductor chip with a smaller size than that of a first semiconductor chip, on the surface of the first semiconductor chip, and electrically connecting a first group of electrodes of the first semiconductor chip with a group of electrodes of the second semiconductor chip through second electroconductive bumps; electrically connecting the first electroconductive bumps with a second group of electrodes of the first semiconductor chip formed on the outer side relative to the region of the first semiconductor chip to which the second semiconductor chip has been connected; and encapsulating the region including the surfaces of the first and second semiconductor chips and the first and second electroconductive bumps using an encapsulating resin.

In this production method, the tip faces of the protruded portions of the inner leads, which function as external terminals, each have a small area. This allows a reduced pitch to be obtained between the tip faces of the protruded portions of the respective inner leads.

BRIEF DESCRIPTION OF THE DRAWINGS

FIG. 3A is a plan view illustrating an improved structure of the resin-encapsulated semiconductor device according to the same embodiment.

FIGS. 3B and 3C are cross-sectional views of the resin-encapsulated semiconductor device taken along line D–D1 and line E–E1 shown in FIG. 3A, respectively.

FIG. 3D is a cross-sectional view illustrating a state where a plurality of resin-encapsulated semiconductor devices according to the embodiment are stacked on top of each other.

DETAILED DESCRIPTION OF THE INVENTION

Figure 1A:
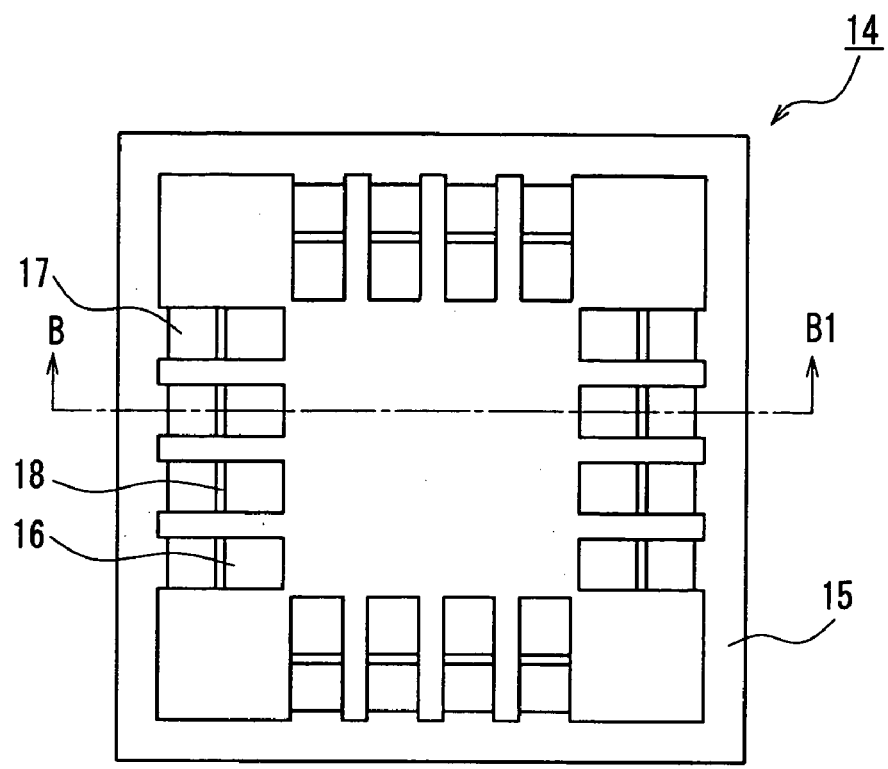
FIG. 1A is a plan view illustrating a lead frame according to an embodiment of the present invention.

In the resin-encapsulated semiconductor device of the present invention, the step portion is formed as a portion with two steps or more. With such a step portion, in the encapsulating step, when a resin tape is interposed between a molding die and the lead frame, the encapsulating resin tends not to flow into between the resin tape and the protruded portions of the lead frame. As a result, the possibility is reduced that the encapsulating resin adheres to the surfaces of the protruded portions. Accordingly, the surfaces of the protruded portions function as external terminals more reliably.

In the resin-encapsulated semiconductor device of the present invention, the semiconductor chip may be composed of a first semiconductor chip and a second semiconductor chip that is stacked on the surface of the first semiconductor chip and has a smaller size than that of the first semiconductor chip. In this case, the protruded portions of the plurality of inner leads are located on the outer side relative to the periphery of the first semiconductor chip. The first group of electrodes of the first semiconductor chip is connected with the surfaces of the inner portions of the inner leads located on the inner side relative to their protruded portions, through the first electroconductive bumps, respectively. The second semiconductor chip is disposed within the region surrounded by inner ends of the plurality of inner leads and is connected electrically with the second group of electrodes of the first semiconductor chip through the second electroconductive bumps. The encapsulating resin encapsulates the surfaces of the first and second semiconductor chips and the first and second electroconductive bumps.

In the resin-encapsulated semiconductor device of the present invention, it is preferable that the surfaces of the protruded portions are substantially in the same plane as the outer face of the encapsulating resin. Furthermore, it is preferable that the back face of the first semiconductor chip and the outer face of the encapsulating resin are substantially in the same plane. It also is preferable that the back faces of the inner leads and the outer face of the encapsulating resin are substantially in the same plane. With these configurations, a plurality of resin-encapsulated semiconductor devices can be stacked stably on top of each other.

Moreover, the inner lead preferably is tilted upward, i.e. to the side on which the protruded portion is provided, toward the inner end of the inner lead. This allows the back face of the inner lead located on its outer end side to protrude relative to its inner portion and thereby to be exposed easily in the encapsulating step to form the external terminal without fail. It also is preferable that ball electrodes are formed on the protruded portions. This makes it possible to improve the reliability of electric connection of the device with a mounting board. Furthermore, another configuration may be employed in which an insulating thin film is formed on a part of the surface of the protruded portions of the inner leads and the part where the insulating thin film has not been formed functions as the external terminal. With this configuration, electrical leakage can be prevented even when the device is mounted directly on a circuit board. Moreover, even when a bending stress is transmitted from the circuit board, the bending stress can be absorbed by the ball electrodes.

Further, a resin-encapsulated semiconductor device can be obtained in which a plurality of resin-encapsulated semiconductor devices with any of the above-mentioned configurations are stacked on top of each other, and adjacent pairs of them are electrically connected to each other with the back faces of the inner leads of one being electrically connected with the surfaces of protruded portions of the other. With this configuration, a plurality of resin-encapsulated semiconductor devices can be stacked easily on top of each other. Accordingly, the resin-encapsulated semiconductor device can perform various functions while requiring a small mount area. In this case, three resin-encapsulated semiconductor devices or more can be stacked on top of each other.

In the encapsulating step of the method of producing a resin-encapsulated semiconductor device according to the present invention, after the encapsulating step, a portion sticking out from the encapsulating resin of the inner leads can be cut off and thereby the structure encapsulated with the resin can be separated from the frame. Preferably, the encapsulating resin is fed with a resin sheet being in close contact with at least the protruded portions. This can prevent the encapsulating resin from adhering to the surfaces of the protruded portions in the encapsulating step and thereby allows the surfaces of the protruded portions to be exposed reliably.

Figure 1B:
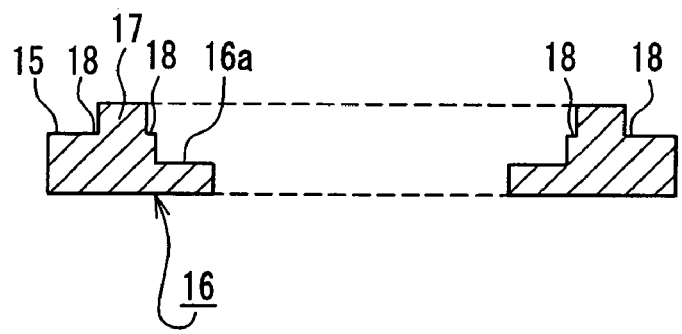
FIG. 1B is a cross-sectional view of the lead frame taken along line B–B1 shown in FIG. 1A.

Hereinafter, embodiments of the present invention are described in detail with reference to the drawings. First, the description is directed to the configuration of a lead frame. FIG. 1A is a plan view illustrating a lead frame 14 according to the present embodiment, and FIG. 1B is a cross-sectional view of the lead frame taken along line B–B1 shown in FIG. 1A.

The lead frame 14 is formed of a metal plate such as, for example, one made of a copper material, a 42-alloy, or the like. A frame 15 has a thickness of 100 µm to 300 µm. A plurality of inner leads 16 are formed to extend inward from the frame 15. Each of the inner leads 16 has a protruded portion 17 on its surface on the outer side. In this connection, the surface of the inner lead 16 denotes the face opposing a semiconductor chip to be mounted, i.e. a face on which an electroconductive bump is formed to establish the electric connection with electrodes of the semiconductor chip. On the inner side relative to the protruded portion 17, an inner end portion is formed of a thin inner part 16a. The protruded portion 17 is provided with step portions 18 that may be formed in its side portions to have half the thickness of the frame 15. The thickness of the step portions 18, however, may be set suitably. In the present embodiment, the thickness of the lead frame 14 is set, for example, at 150 µm, and the step portions 18 each may be provided with two steps or more.

Figure 1C:
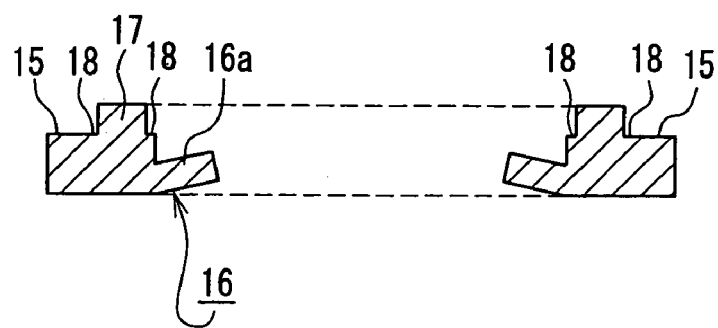
FIG. 1C is a cross-sectional view of an improved structure of the lead frame according to the same embodiment.

As shown in FIG. 1C, each inner lead 16 may be tilted upward, i.e. to the side on which the protruded portion protrudes, toward an inner end of the inner portion 16a. Thereby the back face of the inner portion 16a is recessed from the back face of the inner lead 16 located on the outer end face side. In other words, the back face of the inner lead 16 located on the outer end face side protrudes beyond the back face of the inner portion 16a.

Next, the description is made with respect to an outline of the method of producing the lead frame 14 according to the present embodiment. First, a structure with a uniform thickness is produced that includes a frame and a plurality of inner leads extending inward from the frame. Thereafter, a part of the surface of each inner lead is half-etched or pressed and thereby a protruded portion is formed on the surface of the inner lead. Then, further half-etching or pressing is carried out from the surroundings of the surface of the protruded portion to provide the side portions of the protruded portion with a step portion.

Figure 2A:
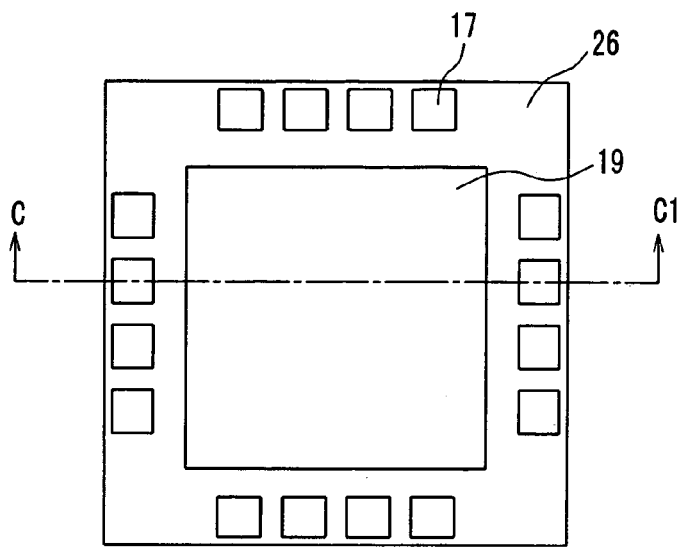
FIG. 2A is a plan view illustrating a resin-encapsulated semiconductor device according to an embodiment of the present invention.
Figure 2B:
FIG. 2B is a side view thereof.
Figure 2C:
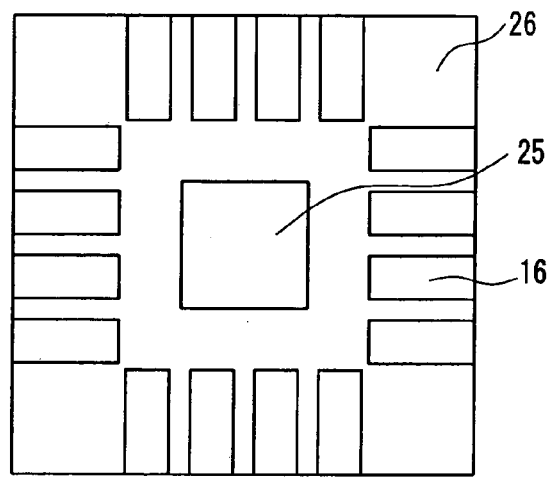
FIG. 2C is a bottom view thereof.
Figure 2D:
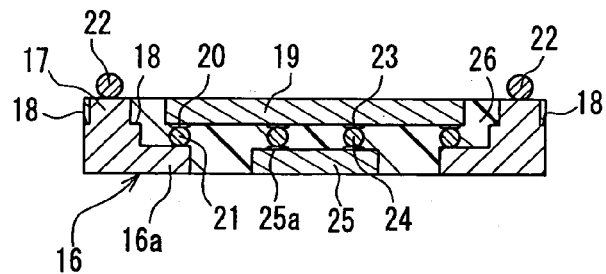
FIG. 2D is a cross-sectional view thereof taken along line C–C1 shown in FIG. 2A.

The following description is directed to a resin-encapsulated semiconductor device of the present embodiment. FIG. 2A is a plan view illustrating a resin-encapsulated semiconductor device; FIG. 2B is a side view thereof; FIG. 2C is a bottom view thereof; and FIG. 2D is a cross-sectional view thereof taken along line C–C1 shown in FIG. 2A. This resin-encapsulated semiconductor device includes the lead frame shown in FIGS. 1A and 1B, and a first semiconductor chip 19 and a second semiconductor chip 25 that are mounted on the lead frame.

FIG. 2A shows a state where the back face of the first semiconductor chip 19 and the surfaces of the protruded portions 17 of the inner leads 16 are exposed from an encapsulating resin 26. FIG. 2B shows a state where outer end faces of the inner leads 16 are exposed from the encapsulating resin 26. FIG. 2C illustrates a state where the back face of the second semiconductor chip 25 and the back faces of the inner leads 16 are exposed from the encapsulating resin 26.

As shown in FIG. 2D, first electroconductive bumps 21 are formed on first electrodes 20 arranged in the peripheral portion of the first semiconductor chip 19. An inner portion 16a of each inner lead 16 extends inward relative to the periphery of the first semiconductor chip 19, and is connected to a corresponding one of the first electroconductive bumps 21. Step portions 18 and the protruded portion 17 of each inner lead 16 are disposed on the outer side relative to the periphery of the first semiconductor chip 19. A ball electrode 22 made of solder or the like to serve as an external electrode is provided on the surface of the protruded portion 17. The tip end of the external electrode 22 protrudes beyond the back face of the first semiconductor chip 19.

Within the region surrounded by inner ends of the plurality of the inner leads 16 is disposed the second semiconductor chip 25 that has a smaller size than that of the first semiconductor chip 19. On the inner side relative to the first electrodes 20 disposed on the surface of the first semiconductor chip 19 are formed second electrodes 23 facing the second semiconductor chip 25. The second electrodes 23 of the first semiconductor chip 19 are connected electrically with electrodes 25a of the second semiconductor chip 25 through second conductive bumps 24. The surfaces of the first and second semiconductor chips 19 and 25 as well as the first and second electroconductive bumps 21 and 24 are encapsulated with an encapsulating resin 26 in such a manner that surfaces of the protruded portions 17 of the inner leads 16 are exposed. The surfaces of the protruded portions 17 and the back face of the first semiconductor chip 19 are substantially in the same plane as the outer face of the encapsulating resin 26. Furthermore, the back faces of the inner leads 16 and the outer face of the encapsulating resin 26 are substantially in the same plane.

In the present embodiment, the formation of the step portions 18 allows each protruded portion 17 disposed on the tip side to have a reduced cross-section. Accordingly, the tip faces of the protruded portions 17 that function as external terminals each have a reduced area, which allows a reduced pitch to be achieved between the tip faces of the protruded portions 17.

With the ball electrodes 22 provided on the protruded portions 17, even when bending stress is transmitted from a circuit board to the resin-encapsulated semiconductor device mounted on the circuit board, the bending stress can be absorbed by the ball electrodes 22.

Each inner lead 16 may be tilted upward as shown in FIG. 1C, i.e. to the side on which the protruded portion protrudes, toward an inner end of the inner portion 16a. Thereby, the back face of the inner lead 16 located on the outer end face side protrudes relative to the back face of the inner portion 16a and thus can be exposed easily from the outer face of the encapsulating resin 26 in the encapsulating step. This allows the device to establish a reliable electric connection with a circuit board and the like.

Furthermore, as shown in FIGS. 3A to 3C, an insulating thin film 33 may be formed on a part of the surface of the protruded portion 17 of each inner lead 16. FIG. 3A is a plan view illustrating a resin-encapsulated semiconductor device. FIGS. 3B and 3C are cross-sectional views of the device taken along line D–D1 and line E–E1 shown in FIG. 3A, respectively. As shown in FIGS. 3A and 3C, the insulating thin film 33 has an aperture 33a. The part of the surface of the protruded portion 17 in the aperture 33a where the insulating thin film 33 is not formed can be used as the external terminal. This can prevent electric leakage from occurring even when the device is mounted directly on a circuit board.

Moreover, a small convex part may be formed on a part of the surface of each inner lead 16 that comes to contact with the first electroconductive bump 21. In this case, the convex part bites into the first electroconductive bump 21 to establish the electrical contact therebetween, and this ensures a stable electric connection between the first electroconductive bump 21 and the inner lead 6. The convex part may be formed to have a concave part at its tip.

Next, the description is directed to the case where a plurality of resin-encapsulated semiconductor devices with the aforementioned configuration are stacked on top of each other. FIG. 3D is a cross-sectional view illustrating the state where a plurality of resin-encapsulated semiconductor devices 27 to 30 are stacked on top of each other, and adjacently stacked pairs of them are electrically connected with each other.

The surfaces of the protruded portions 17 of the inner leads 16 provided in the resin-encapsulated semiconductor device 29 disposed on the lower side are connected to the back faces of the inner leads 16 provided in the resin-encapsulated semiconductor device 28 disposed on the upper side, through the ball electrodes 22 made of solder. Thus, according to the present embodiment, a plurality of resin-encapsulated semiconductor devices can be stacked on top of each other and easily can be connected to each other electrically. Accordingly, a resin-encapsulated semiconductor device of a high-density packaging type can be obtained that performs various functions while requiring a mount area needed for one resin-encapsulated semiconductor device. The number of the resin-encapsulated semiconductor devices to be stacked on top of each other can be selected suitably.

The following description is directed to a method of producing the resin-encapsulated semiconductor device with the aforementioned configuration. First, the description is made about a first production method according to the present embodiment with reference to FIGS. 4A to 4D.

Figure 4A:
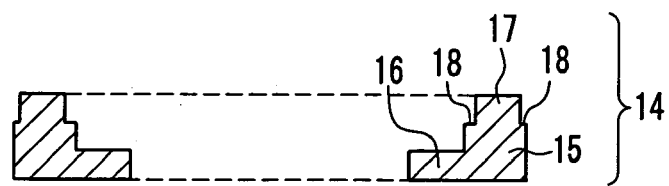
FIGS. 4A to 4D are cross-sectional views illustrating respective steps of a method of producing the resin-encapsulated semiconductor device shown in FIGS. 2A to 2D.
Figure 4B:
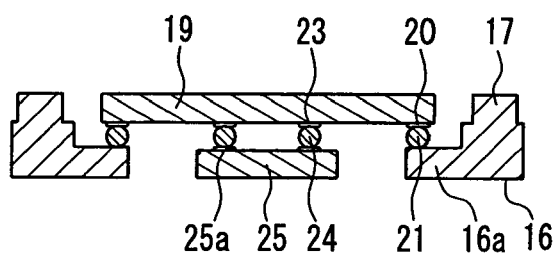

As shown in FIG. 4A, the lead frame 14 shown in FIG. 1 is prepared. Next, as shown in FIG. 4B, first electroconductive bumps 21 are formed on the surfaces of the inner portions 16a of the inner leads 16. Separately, a first semiconductor chip 19 and a second semiconductor chip 25 are stacked on top of each other, and second electrodes 23 of the first semiconductor chip 19 are connected electrically with electrodes 25a of the second semiconductor chip 25 through second electroconductive bumps 24. Subsequently, the structure with the first semiconductor chip 19 and the second semiconductor chip 25 that are stacked on top of each other is combined with the lead frame 14 as shown in the drawing. First electrodes 20 of the first semiconductor chip 19 and first electroconductive bumps 21 formed on the inner leads 16 are electrically connected correspondingly to each other.

Figure 4C:
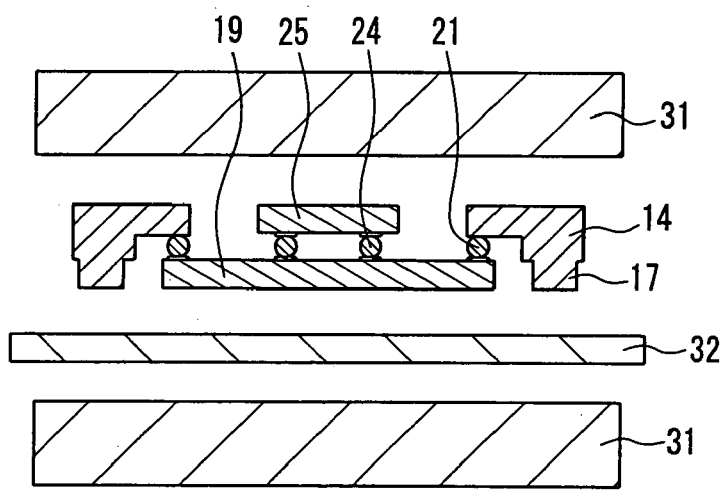
Figure 4D:
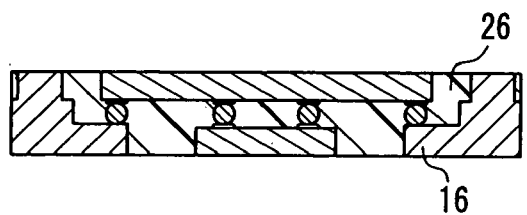

Next, as shown in FIG. 4C, the lead frame 14 and the first and second semiconductor chips 19 and 25 are inserted into a molding die 31, and then the surfaces of the first and second semiconductor chips 19 and 25 and the first and second electroconductive bumps 21 and 24 are encapsulated with an encapsulating resin 26 (see FIG. 4D). Subsequently, as shown in FIG. 4D, a portion stuck out from the encapsulating resin of the inner leads 16, which is not shown in the drawing, is cut off and thereby the resin-encapsulated structure is separated from the frame.

In the encapsulating step shown in FIG. 4C, the surfaces of the protruded portions 17 are exposed from the encapsulating resin 26 in such a manner as to be substantially in the same plane as the outer face of the encapsulating resin 26, as shown in FIG. 4D. In this step, the encapsulating resin 26 is injected into the molding die 31 with a resin sheet 32 being in close contact with the back face of the first semiconductor chip 19 and the surfaces of the protruded portions 17 of the lead frame 14. This prevents the encapsulating resin 26 from being formed on the surfaces of the protruded portions 17. Accordingly, an adequate electric connection is secured between the protruded portions 17 and wiring electrodes of a mounting board.

Figure 5A:
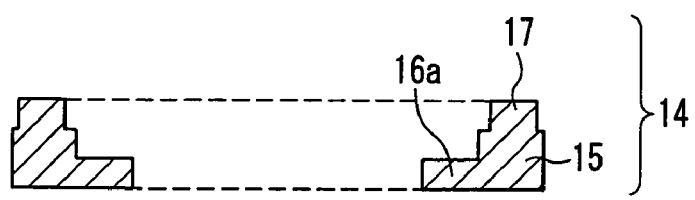
FIGS. 5A to 5E are cross-sectional views illustrating respective steps of another method of producing the resin-encapsulated semiconductor device.
Figure 5B:
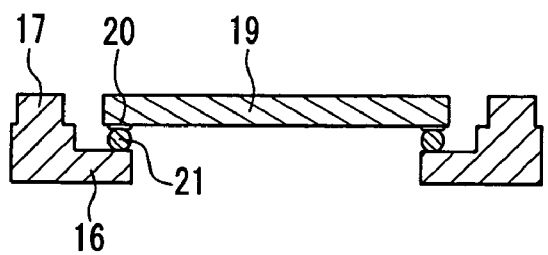
Figure 5C:
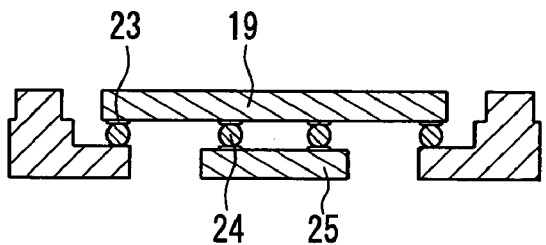

Next, a second method of producing a resin-encapsulated semiconductor device is described with reference to FIGS. 5A to 5E. First, as shown in FIG. 5A, the lead frame 14 shown in FIG. 1 is prepared. Subsequently, as shown in FIG. 5B, first electrodes 20 of a first semiconductor chip 19 and the inner portions 16a of the inner leads 16 are electrically connected to each other through first electroconductive bumps 21. Thereafter, as shown in FIG. 5C, second electrodes 23 of the first semiconductor chip 19 and electrodes 25a of a second semiconductor chip 25 are connected electrically to each other through second electroconductive bumps 24.

Figure 5D:
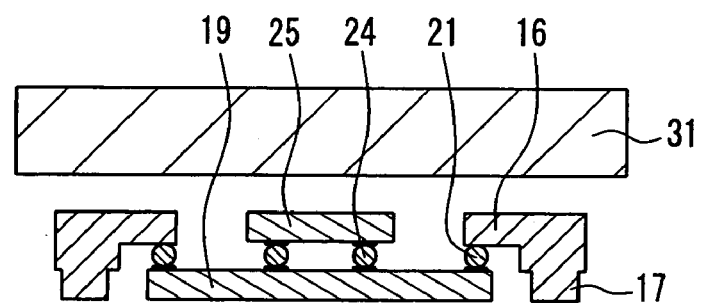
Figure 5E:
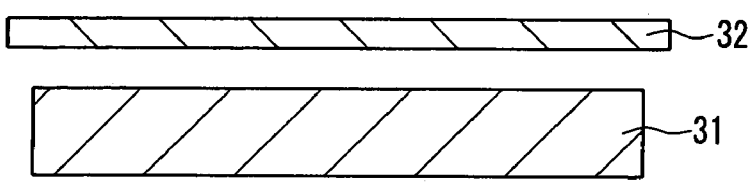
Figure 5E:
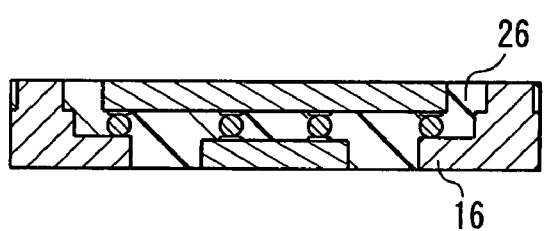
Figure 6:
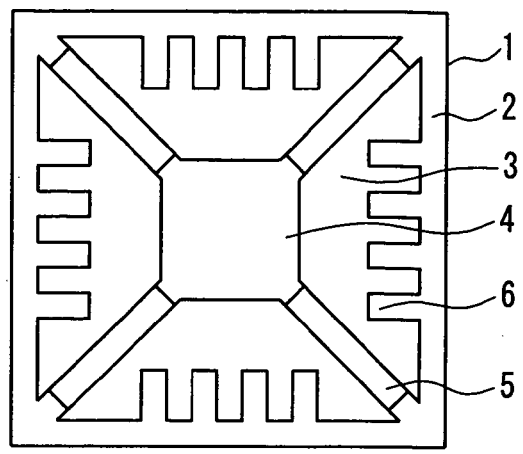
FIG. 6 is a plan view illustrating a conventional lead frame.
Figure 7A:
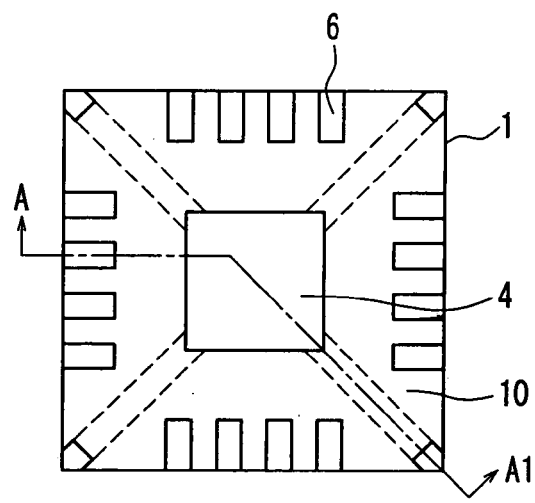
FIG. 7A is a plan view illustrating a conventional resin-encapsulated semiconductor device.
Figure 7B:
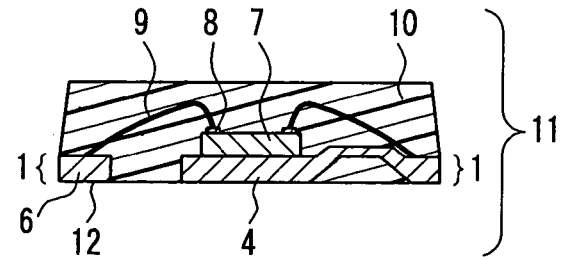
FIG. 7B is a cross-sectional view thereof taken along line A–A1 shown in FIG. 7A.
Figure 8A:
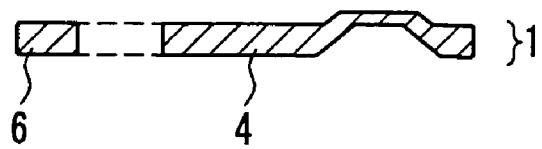
FIGS. 8A to 8E are cross-sectional views illustrating respective steps of a method of producing the conventional resin-encapsulated semiconductor device.
Figure 8B:
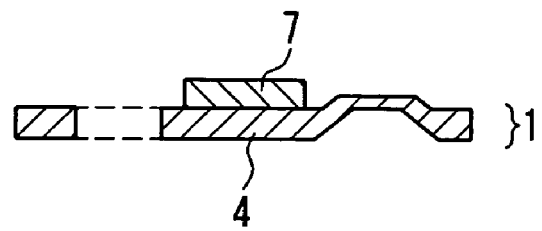
Figure 8C:
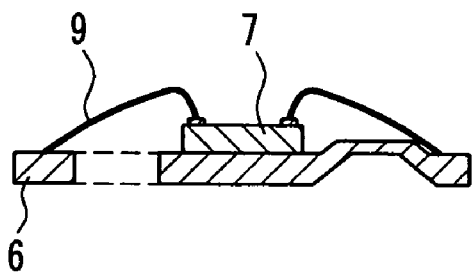
Figure 8D:
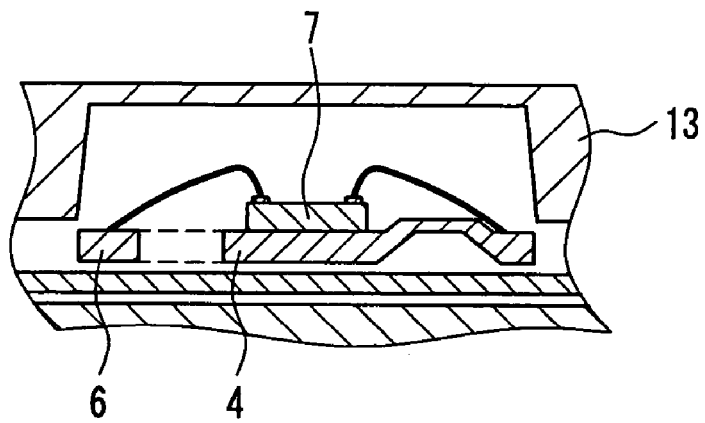
Figure 8E:
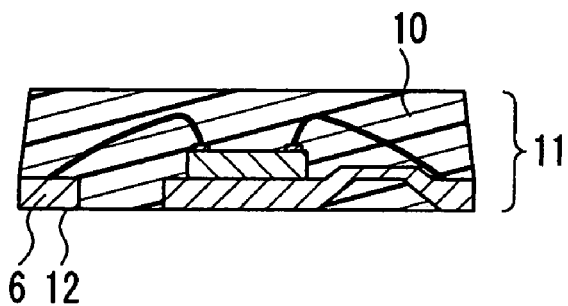

Then, as shown in FIG. 5D, the surfaces of the first and second semiconductor chips 19 and 25 and the first and second electroconductive bumps 21 and 24 are encapsulated with an encapsulating resin 26 (see FIG. 5E) using a molding die 31 and a resin sheet 32. Subsequently, as shown in FIG. 5E, a portion stuck out from the encapsulating resin of the inner leads 16, which is not shown in the drawing, is cut off and thereby the resin-encapsulated structure is separated from the frame. In the encapsulating step shown in FIG. 5D, the surfaces of the protruded portions 17 are exposed from the encapsulating resin 26 in such a manner as to be substantially in the same plane as the outer face of the encapsulating resin 26 as shown in FIG. 5E.

According to the production methods of the present embodiment described above, a thin resin-encapsulated semiconductor device with a thickness of 0.8 mm or less can be produced easily. Accordingly, the resin-encapsulated semiconductor device can be contained in a thin standardized PC card with each side thereof being mounted on a mount board.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A lead frame, comprising:
   a frame; and
   a plurality of inner leads, extending inward from the frame,
   wherein the inner lead includes a protruded portion provided on a surface of its outer portion, the protruded portion protrudes in a thickness direction so as to have a thickness larger than an inner portion of the inner lead, and at least one step portion is formed on each of an inner and outer side portions of the protruded portion.

2. The lead frame according to claim 1, wherein each of the inner leads is tilted to a side on which the protruded portion is formed toward an inner end of the inner lead.

3. The lead frame according to claim 1, wherein a back face of each of the inner leads, just below the protruded portion, forms the lowest part of the inner leads.

4. The lead frame according to claim 2, wherein a back face of each of the inner leads, just below the protruded portions, forms the lowest part of the inner leads.

5. A resin-encapsulated semiconductor device, comprising:
   a semiconductor chip having a group of electrodes;
   a plurality of inner leads that are arranged along a periphery of the semiconductor chip and are connected to the group of electrodes of the semiconductor chip, respectively; and
   an encapsulating resin that encapsulates a connection part located between the semiconductor chip and the inner leads, with a part of each of the inner leads being exposed from the encapsulating resin to form an external terminal,
   wherein the inner lead includes a protruded portion provided on a surface thereof on an outer side relative to the periphery of the semiconductor chip, the protruded portion protruding in a thickness direction so as to have a thickness larger than the inner portion of the inner lead with at least one step portion formed on each of the inner and the outer side portions of the protruded portion,
   the group of electrodes of the semiconductor chip is connected to surfaces of inner portions of the inner leads located on an inner side relative to their protruded portions, through electroconductive bumps, respectively, and
   the encapsulating resin encapsulates the semiconductor chip and the electroconductive bumps and is formed to expose surfaces of the protruded portions.

6. The resin-encapsulated semiconductor device according to claim 5,
   wherein the semiconductor chip includes a first semiconductor chip and a second semiconductor chip that is stacked on a surface of the first semiconductor chip and has a smaller size than that of the first semiconductor chip,
   the protruded portions of the plurality of inner leads are located on an outer side relative to a periphery of the first semiconductor chip,
   a first group of electrodes of the first semiconductor chip is connected with the surfaces of the inner portions of the inner leads located on the inner side relative to their protruded portions, through first electroconductive bumps, respectively,
   the second semiconductor chip is disposed within a region surrounded by inner ends of the plurality of inner Leads and is connected electrically with a second group of electrodes of the first semiconductor chip through second electroconductive bumps, and
   the encapsulating resin encapsulates surfaces of the first and second semiconductor chips and the first and second electroconductive bumps.

7. The resin-encapsulated semiconductor device according to claim 5, wherein the surfaces of the protruded portions and an outer face of the encapsulating resin are substantially in the same plane.

8. The resin-encapsulated semiconductor device according to claim 5, wherein a back face of the semiconductor chip and an outer face of the encapsulating resin are substantially in the same plane.

9. The resin-encapsulated semiconductor device according to claim 5, wherein back faces of the inner leads and an outer face of the encapsulating resin are substantially in the same plane.

10. The resin-encapsulated semiconductor device according to claim 5, wherein the inner lead is tilted gradually to a side on which the protruded portion is formed, toward an inner end of the inner lead.

11. The resin-encapsulated semiconductor device according to claim 5, wherein a plurality of ball electrodes are formed on the protruded portions.

12. The resin-encapsulated semiconductor device according to claim 5, wherein an insulating thin film is formed on a part of the surface of the protruded portions of the inner leads, and a part of the surface of the protruded portion where the insulating thin film has not been formed functions as an external terminal.

13. A resin-encapsulated semiconductor device, wherein a plurality of resin encapsulated semiconductor devices according to claim 5 are stacked on top of each other, and in adjacent pairs, back faces of inner leads of one are connected electrically with surfaces of protruded portions of an other.

14. The resin-encapsulated semiconductor device according to claim 13, wherein at least three resin-encapsulated semiconductor devices are stacked on top of each other.

* * * * *